United States Patent [19]
Semenov et al.

[11] Patent Number: 5,818,373
[45] Date of Patent: Oct. 6, 1998

[54] INTERFACE BETWEEN SUPERCONDUCTOR AND SEMICONDUCTOR ELECTRONIC CIRCUITS USING PHASE-SHIFT KEYING CODED OUTPUT DATA FORMAT

[75] Inventors: Vasili Semenov; David F. Schneider, both of Stony Brook, N.Y.; Jao-Ching Lin, Sunnyvale, Calif.; Stanislav Polonsky, Stony Brook, N.Y.

[73] Assignee: Research Foundation of State University of New York, Stony Brook, N.Y.

[21] Appl. No.: 772,017

[22] Filed: Dec. 19, 1996

[51] Int. Cl.$^6$ ........................................ H03M 1/00
[52] U.S. Cl. ................................ 341/133; 327/527
[58] Field of Search ..................... 341/133; 363/14; 327/527, 528

[56] References Cited

U.S. PATENT DOCUMENTS 5,272,479  12/1993  Silver ............................ 341/133
5,396,242  3/1995  Lee ............................... 341/133
5,598,105  1/1997  Kurosawa et al. .................. 326/6

*Primary Examiner*—Marc S. Hoff
*Attorney, Agent, or Firm*—Baker & Botts, L.L.P.

[57] ABSTRACT

Disclosed herein are circuits and methods for receiving SFQ data pulses from a superconductor signal source, and first and second clock pulses that are substantially equal in frequency but opposite in phase from clock signal sources, and for encoding and converting the SFQ data pulses into a phase-shift-keying coded dc output voltage. The circuit includes RSFQ T-RS flip-flop means, including quantizing means for storing a current in one of two stable states, which is responsive to the first and second clock pulses and the data pulse, for PSK coding the SFQ data pulses. The circuit also includes a SFQ/DC converter, which is coupled to the quantizing means of the RSFQ T-RS flip-flop means and is responsive to a state of the current stored in the quantizing inductance loop, for converting the PSK coded SFQ data pulses into a PSK coded dc voltage.

20 Claims, 3 Drawing Sheets

INTERFACE BETWEEN SUPERCONDUCTOR AND SEMICONDUCTOR ELECTRONIC CIRCUITS USING PHASE-SHIFT KEYING CODED OUTPUT DATA FORMAT

NOTICE OF GOVERNMENT RIGHTS

The U.S. Government has a certain rights in this invention pursuant to the terms of contract No. F49620-92-J-0508 awarded by the Air Force Office of Scientific Research (DoD).

BACKGROUND OF THE INVENTION

I. Field of the invention.

The present invention relates to the interfacing of superconductor and semiconductor electronic circuits, and more particularly to the interfacing of Rapid Single-Flux-Quantum Josephson-junction circuits to room temperature electronic circuits by way of Phase-Shift-Keying coded data.

II. Description of the related art.

In recent years, the need for faster digital circuits, including analog-to-digital converters, digital-to analog converters, and digital switches, has become increasingly apparent. Unfortunately, traditional room temperature semiconductor electronic devices have been unable to adequately meet this need.

As an example, with respect to digital switching circuits, room temperature semiconductor electronic technologies can handle multi-gigabit frequencies only if broad parallel circuits are employed, which necessitates unacceptably high power consumption. For this reason, research has turned to superconductor electronics as a viable alternative to traditional semiconductor electronics for ultrafast applications.

In particular, a library of Rapid Single-Flux-Quantum ("RSFQ") devices have been developed over the past few years in order to provide ultrafast processing at low power consumption. RSFQ devices store and process digital bits in the form of single quanta of magnetic flux $\Phi_o$, transferring them in the form of short Single-Flux-Quantum ("SFQ") pulses V(t) having a quantized area $\int V(t)dt \approx 2$ mV·pS. This data representation, which is natural in superconductor devices, allows RSFQ logic to achieve extremely high clock frequencies in the order of hundreds of GHz. For example, the article by P. I. Bunyk et. al., "High Speed Single-Flux-Quantum Circuit Using Planarized Niobium-Trilayer Josephson Junction Technology," 66 Appl. Phy. Lett. 646 (1995) discloses a simple asynchronous binary counter which operates at a frequency in excess of 200 GHz.

Importantly, the ballistic propagation of signals in RSFQ circuits allows even complex circuits to operate in the GHz clock frequency range. Due to a fundamental energy loss of about $10^{-18}$ J/bit, such RSFQ circuits realize the goal of achieving considerably reduced power consumption (when compared to their semiconductor counterparts) at high clock frequencies.

Due to their ability to provide ultrafast processing at low power consumption, the use of RSFQ circuits in digital systems which include room temperature semiconductor electronic components has become increasingly desirable. This necessitates the need to convert SFQ pulses, the data representation of RSFQ logic, into standard dc signals (a "SFQ/DC" converter) and conversely to convert dc signals into SFQ pulses (a "DC/SFQ" converter). Because semiconductor circuits operate at much higher signal power levels as compared to RSFQ circuits, sending data from semiconductor devices to RSFQ circuits is a relatively simple task. Sending data from RSFQ circuits to the semiconductor environment presents a far more formidable challenge.

A simple SFQ/DC converter will convert a Return-to-Zero ("RZ") SFQ signal into an output dc voltage of the order of 100 $\mu$V, a signal that must be amplified by several orders of magnitude before it can be passed on to semiconductor electronic devices. Typically, such signal amplification will be effected by an array of semiconductor preamplifiers. However, a significant problem with such signal amplification lies in the fact that the output voltage signal may become contaminated by a non-zero dc component in the aforementioned RZ data, thereby reducing the noise margin of the room temperature semiconductor circuits which receive and further process the data.

One technique to reduce the noise introduced by semiconductor signal preamplification is to amplify the SFQ/DC output signal on the superconductor side of the interface. Such a technique is proposed in the article authored by the inventors of the present invention, D. F. Schneider et al., "Broadband Interfacing of Superconducting Digital Systems to Room Temperature Electronics," 5 IEEE Trans. Applied Superconductivity 3152 (1995), the disclosure of which is incorporated by reference herein. The Schneider et al. article describes the use of a Josephson transmission line and a Hybrid Unlatching Flip-Flop Logic Element ("HUFFLE") circuit to amplify the output of a low-voltage SFQ/DC converter to obtain an output voltage of approximately 1.5 mV, a considerable improvement over the bare SFQ/DC converter. However, the output signal is still subject to further amplification by an array of semiconductor preamplifiers, and accordingly, noise introduced by any non-zero dc component may still be introduced into semiconductor electronics.

An alternative approach to providing a clean output signal lies in the use of Phase-Shift-Keying ("PSK") or Manchester coding. The main attraction of PSK coding lies in the fact that while it contains a strong timing component, PSK coding contains a zero dc spectral component. In PSK coded data, one cycle of a square wave with a particular phase is used to represent a "1" while the cycle of the square wave of opposite phase is used to represent a "0." The use of such coding in the semiconductor environment is well-known and is fully described in J. D. Gibson, "Principals of Digital and Analog Communications," pp. 251–252 (Macmillan Publishing Co., 2d ed. 1993), the disclosure of which is incorporated by reference herein.

In the article by S. M. Schwarzbek et al., "Operation of SAIL HTS Digital Circuits Near 1 GHz," 5 IEEE Trans. Applied Superconductivity 3176 (1995), a Series Array Interferometer Logic ("SAIL") gate which acts an exclusive OR ("EXOR") logic element is disclosed as a PSK modulator in the superconductor environment. The SAIL gate includes two dc Superconducting Quantum Interference Devices ("dc SQUIDs"), each of which is essentially a superconducting loop having two Josephson junctions. Two inputs (in the form of transmission lines) are directed to one of the SQUIDs, with one input designated to be fed with a high speed carrier signal and the second with a slower rate data signal. With this arrangement, the output signal will either follow the carrier signal, or be inverted with respect to that signal by the data signal. The output signal will be noiseless as it is always in one of two states (high or low), and never in a state with an intermediate apparent phase.

Although the SAIL gate provides a clean signal that may be verily decoded and passed on to semiconductor electronics, it does not provide an adequate mechanism for receiving data from RSFQ circuits. This is due to an incompatibility of information presentation. Although information in the SAIL gate is presented through the presence or absence of a current, information in an RSFQ cell is presented through the presence or absence of a short voltage pulse. Accordingly, there exists a need in the art for a reliable, high-speed technique for sending data from RSFQ circuits to a semiconductor circuit.

SUMMARY OF THE INVENTION

An object of the present invention is to provide a reliable, high-speed technique for sending data from RSFQ circuits to a semiconductor circuit.

A further object of the present invention is to eliminate the contamination of an RSFQ output signal by a non-zero dc component in the signal.

An additional object of the present invention is to provide a superconductor circuit to semiconductor circuit interface which does not reduce the noise margin of the semiconductor circuits which receive and further process data provided by superconductor circuits.

Yet another object of the present invention is to effectively utilize PSK modulation in the superconductor side of the interface.

In order to meet these and other objects which will become apparent with reference to further disclosure below, the present invention provides a circuit for receiving SFQ data pulses from a superconductor signal source, and first and second clock pulses that are substantially equal in frequency but opposite in phase from first and second clock signal sources, and for encoding and converting the SFQ data pulses into a phase-shift-keying coded dc output voltage. The circuit includes RSFQ T-RS flip-flop circuitry, including quantizing circuitry for storing a current in one of two stable states, which is responsive to the first and second clock pulses and the data pulse, for PSK coding the SFQ data pulses. The circuit also includes a SFQ/DC converter, which is coupled to the quantizing circuitry of the RSFQ T-RS flip-flop circuitry and is responsive to a state of the current stored in the inductance loop of the quantizing circuitry, for converting the PSK coded SFQ data pulses into a PSK coded dc voltage.

In one embodiment, the quantizing circuitry is a quantizing inductance loop within the T-RS RSFQ circuitry. The quantizing inductance loop is capable of storing a current in one of two stable states, a high state and a low state, which are distinguishable by the number of flux quanta trapped in the loop.

In this embodiment, the RSFQ circuit also includes a current source and two Josephson junction rings. The current source is coupled to the input end of the quantizing inductance loop to furnish an electrical current to the quantizing inductance loop to establish the stored current.

The first Josephson junction ring is formed of two pairs of Josephson junctions with two input points between each pair of junctions, and is coupled to an input end of the quantizing inductance loop at a position between the two pairs of Josephson junctions. The first ring is coupled for receiving the data pulse at a first of its input points and the second clock pulse at a second of its input points, for setting a state of the stored current into one of the two stable states, and for toggling the set state of the stored current into a different one of the two stable states.

The second Josephson junction ring is likewise formed of two pairs of Josephson junctions with two input points between each pair of junctions, and is coupled to the output end of the quantizing inductance loop at a position between the two pairs of Josephson junctions. The second ring is coupled for receiving the first clock pulse at a first of the input points and the second clock pulse at a second of the input points, for resetting a state of the stored current into one of the two stable states, and for toggling the reset state of the stored current into a different one of the two stable states.

The quantizing inductance loop may be in the form of two storage loops of unequal inductance connected in series. In such an arrangement, the SFQ/DC converter, which may include a HUFFLE circuit for preamplifying the coded dc voltage, is advantageously coupled to the quantizing inductance loop at a position between the two storage loops.

In a preferred arrangement, the RSFQ T-RS flip-flop circuit also includes four auxiliary Josephson junctions, with each of the two input points of the first Josephson junction ring and each of the two input points of the second Josephson junction ring coupled to one auxiliary Josephson junction. In such an arrangement, the first ring is constructed to receive the data pulse and the second clock pulse through separate auxiliary junctions, and the second ring is constructed to receive the first clock pulse and the second clock pulse through other separate auxiliary junctions.

Preferably, in such an arrangement, one auxiliary junction from each ring may be coupled to a common line, so that the second input point of the first Josephson junction ring and the second input point of the second Josephson junction ring receive the second clock pulse through the common line. In addition, three input inductances may be added to the circuit, where one input inductance is coupled to the common line to receive the second clock signal, a second input inductance is coupled to a first auxiliary junction to receive the data signal, and a third input inductance is coupled to a third auxiliary junction to receive the first clock signal.

The present invention also provides a method for encoding and converting SFQ data pulses generated by a superconducting signal source into a PSK coded dc output voltage. The steps of the method are (a) establishing a quantized current in one of two quantized states; (b) receiving a first clock pulse and any generated single-flux-quantum data pulses during a first portion of a clock cycle; (c) causing the quantized current to be in a first of the two quantized states if a first predetermined number of data pulses are received in step (b); (d) causing the quantized current to be in a second of the two quantized states if a second predetermined number of data pulses are received in step (b); (e) receiving a second clock pulse during a second portion of the clock cycle; (f) toggling the quantized current from the first quantized state to the second quantized state if the quantized current is in the first quantized state, or from the second quantized state to the first quantized state if the quantized current is in the second quantized state; and (g) converting, based on the quantized state of the quantized current, the single-flux-quantum data pulses into a phase-shift-keying coded dc voltage.

In a preferred method, the first clock pulse is received approximately one hundred picoseconds prior to receiving one single-flux-quantum data pulse if the superconducting signal source has generated a data pulse during a corresponding clock cycle. When the first clock signal is received prior to the data pulse, step (c) may include the sub-steps of resetting, after receiving the first clock pulse, the quantized current to a low state if the quantized current was in a high state during an immediately preceding clock cycle portion, and setting, after receiving the data pulse, the quantized current to a high state if one data pulse is received during the first clock cycle portion. Likewise, step (d) may include resetting the quantized current to a low state if no data pulses are received during the first clock cycle portion and if the quantized current was in a high state during an immediately preceding clock cycle portion.

The accompanying drawings, which are incorporated and constitute part of this disclosure, depict a preferred embodiment of the invention and serve to illustrate the principles of the invention.

DESCRIPTION OF THE PREFERRED EMBODIMENTS

Figure 1:
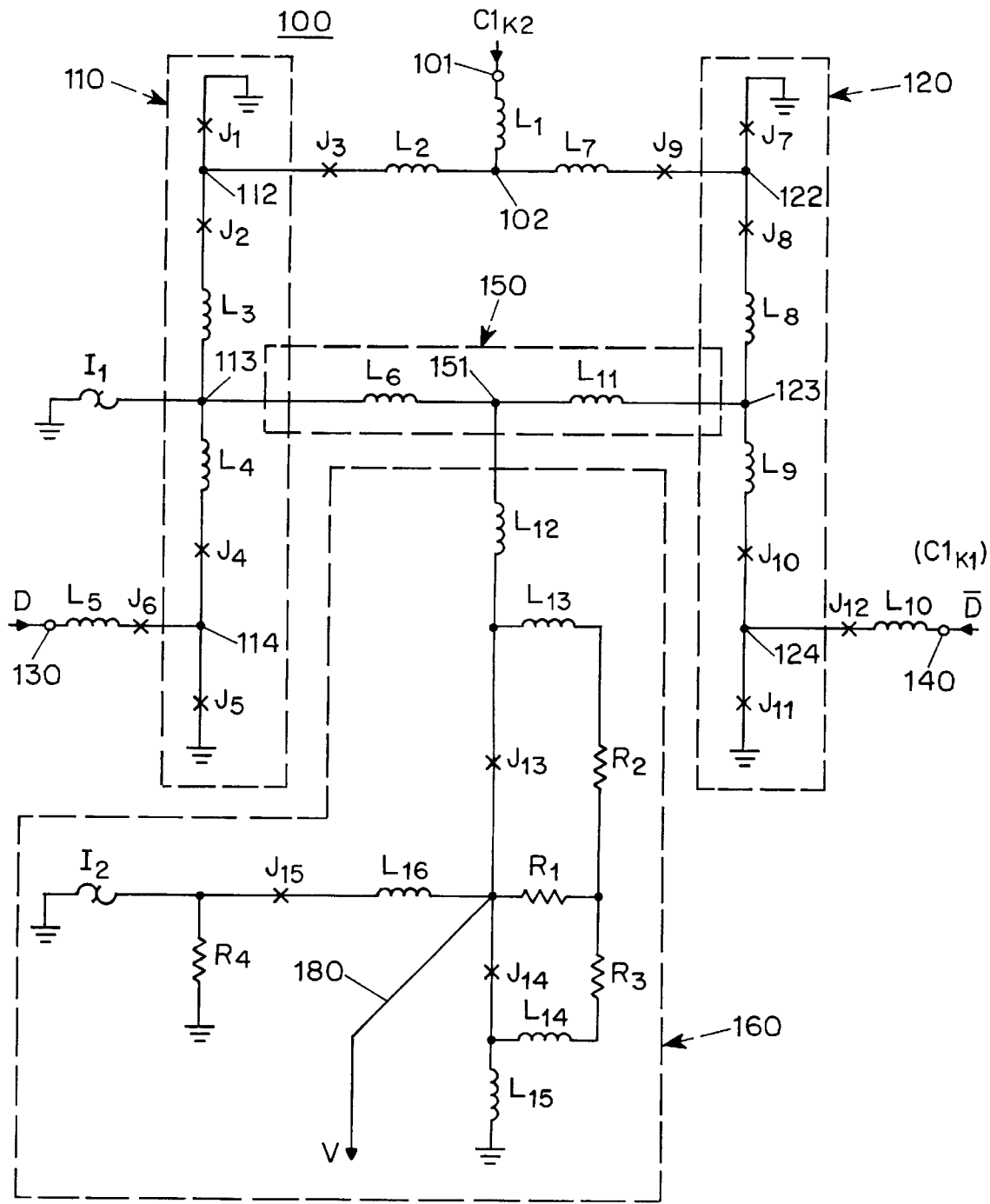
FIG. 1 is a circuit diagram of an exemplary SFQ/DC converter including a Phase-Shift-Keying circuit in accordance with the present invention.

Referring to FIG. 1, an embodiment of the present invention is now described. The circuit 100 receives SFQ data pulses D at 130 from a superconducting signal source (not shown), such as another RSFQ logic circuit. The circuit 100 also receives a system clock pulse $ClK_1$ at 140 from a system clock (not shown), and a second clock pulse $ClK_2$ at 101 from a second clock signal source (also not shown). Second clock pulse $ClK_2$ is substantially equal in frequency to $ClK_1$, but differs in phase by 180°. Preferably, the clock signals $ClK_1$ and $ClK_2$ have a frequency ranging from 100 KHz to 2 GHz depending on the application. The circuit 100 uses the clock signals $ClK_1$ and $ClK_2$ to encode the SFQ data pulses D into a PSK coded dc output voltage, as will be described below.

The circuit 100 includes a quantizing inductance 150 and two Josephson junction rings 110, 120 which form the core of a modified RSFQ T-RS flip-flop circuit with four inputs 112, 114, 122, and 124. The T-RS flip-flop subfamily of RSFQ circuits is generally described in Stanislav V. Polansky et al., "Single Flux, Quantum B Flip-Flop and Its Possible Applications," 4 IEEE Trans. Applied Superconductivity 9 (1994), the disclosure of which is incorporated by reference herein. The operation of the modified T-RS flip-flop circuit shown in FIG. 1 is now described.

Each Josephson junction ring essentially consists of four Josephson junctions connected in a series loop that includes two ground terminals. Thus ring 110 includes junctions $J_1$, $J_2$, $J_4$, and $J_5$ connected in a series loop that includes ground, while ring 120 includes the ground and junctions $J_7$, $J_8$, $J_{10}$, and $J_{11}$ connected in a series loop that includes ground. Ring 110 is connected to the quantizing inductance 150 at point 113 which lies in between junctions $J_2$ and $J_4$. Ring 120 is also connected to the quantizing inductance 150 at point 123 which lies in between junctions $J_8$ and $J_{10}$. The Josephson junctions $J_1$, $J_2$, $J_4$, $J_5$, $J_7$, $J_8$, $J_{10}$, and $J_{11}$ should be chosen to have nominal values that are suitable for the voltages associated with signals D, $ClK_1$ and $ClK_2$. For typical SFQ voltage pulses of approximately 2 mV·ps, the junctions should have nominal values substantially within the range of 0.25–0.27 mA.

Auxiliary inductances $L_3$ and $L_4$ may be included in ring 110 at points above and below the junction point 113 to provide more sequential, rather than simultaneous switching of either junctions $J_2$ and $J_5$ or $J_1$ and $J_4$, as will be described below. Likewise, auxiliary inductances $L_8$ and $L_9$ may be included in ring 120 above and below the junction point 123. The inclusion of auxiliary inductances $L_3$, $L_4$, $L_8$ and $L_9$ have the effect of widening of the parameter margins associated with the circuit.

The quantizing inductance 150 includes loops $L_6$, $L_{11}$, which act as a single main storage loop. The overall inductance of loops $L_6$, $L_{11}$, should be relatively large as compared with the auxiliary inductances. It is desirable to use two loops in the context of the present invention so that an SFQ/DC converter 160 may be linked to the quantizing inductance 150 at a convenient point 151 which lies between the loops $L_6$, $L_{11}$. Further, in order to increase the overall margin of the circuit, it is desirable for one of the loops to have a greater inductance than the other, e.g., by setting $L_6$ to a greater value than $L_{11}$, to create an asymmetrical circuit. In the embodiment shown in FIG. 1, storage loop $L_6$ preferably has a nominal value of approximately 2.89 pH, and storage loop $L_{11}$, preferably has a nominal value of approximately 1.05 pH.

The current source $I_1$ is connected to one end 113 of the quantizing inductance 150, and furnishes an electrical current to the quantizing inductance to establish a stored current within the loops $L_6$ and $L_{11}$.

Auxiliary Josephson junctions $J_3$, $J_6$, $J_9$, and $J_{12}$, may be linked to the circuit at each of the four inputs 112, 114, 122, and 124, respectively. The purpose of these auxiliary junctions will be described below. As shown in FIG. 1, junction $J_6$ and an input inductance $L_5$ are serially connected between input point 114 of ring 110 and data input terminal 130. Thus, data D in the form of SFQ pulses which arrive at data terminal 130 will enter the left Josephson junction ring 110 at input point 114. Junction $J_{12}$ and an input inductance $L_{10}$ are likewise serially connected between input point 124 of ring 120 and system clock input terminal 140, so that system clock pulses $CLK_1$ in the form of SFQ pulses which arrive at the system clock terminal 140 will enter the right Josephson junction ring 120 at input point 124. Junctions $J_3$ and $J_9$ are connected to input points 112 and 122 of rings 110, 120, respectively, and are connected to each other to form a serial connection between input points 112 and 122 of rings 110 and 120. The common point 102 linking junctions $J_3$ and $J_9$ is connected to the second clock terminal 101 via input inductance $L_1$, so that the second clock signal $ClK_2$ passes through input inductance $L_1$ and is split between the left input branch $J_3$, 112, and the right input branch $J_9$, 122 to reach input points 112 and 122 of rings 110 and 120, respectively. Inductances $L_2$ and $L_7$ represent the parasitic inductances of the left and right Josephson junction rings 110 and 120, respectively.

The T-RS flip-flop circuit 110, 120, 150 has two stable states which are distinguished by the number of flux quantum which are trapped in the main storage loop 150, i.e., by the value of the dc current flowing through loops $L_6$, $L_{11}$. The circuit possesses substantial top-bottom and left-right symmetries, and can be set to a logic "1" state by an SFQ pulse arriving at either of the two inputs 112, 114, or reset to a logic "0" state by an SFQ pulse arriving at either of the two inputs 122, 124.

The T-RS flip-flop circuit 110, 120, 150 constructed in accordance with the above description operates in the following manner. When the T-RS flip-flop circuit is in an initial "0" state, the bias current provided by source $I_1$ is mostly split between the two arms of the left Josephson junction ring, traveling to ground via junction pairs $J_1, J_2$ and $J_4, J_5$, respectively. An SFQ pulse arriving at input 114 via data input terminal 130 switches sub-critically biased junction $J_5$. The pulse generated by this switching steers additional current into junctions $J_1$ and $J_2$. Because some of the current drawn through junction $J_2$ will be diverted at input 112, only a portion of this current reaches junction $J_1$. Thus, it is the function of junction $J_2$ that is switched by the arrival of this additional current. The switching, which is a $2\pi$—leap of Josephson phase, of junctions $J_5$ and $J_2$ steers most of the bias current into the loops $L_6$, $L_{11}$ and hence into the right Josephson ring 120. The circuit is thus switched into state "1".

Similarly, if the circuit is in an initial state of "0", an SFQ pulse arriving at input 112 via second clock terminal 101 switches sub-critically biased junction $J_1$, which in turn steers additional current into junctions $J_4$ and $J_5$ to thereby switch junction $J_4$, causing most of the bias current to be steered into the loops $L_6$, $L_{11}$, and hence into the right josephson ring 120. The circuit is likewise switched into state "1" under such conditions.

If, however, the circuit is already in the "1" state when an SFQ pulse arrives at input 112, practically all of the bias current is flowing through the right Josephson ring 120 already, and the pulse cannot switch the unbiased junction $J_5$. Instead, the pulse switches the auxiliary junction $J_6$ with no consequence for the state of the circuit. Auxiliary junction $J_3$ works in a similar manner where a SFQ pulse arrives at input 114 and the circuit is already in the "1" state. In this manner, the auxiliary junctions $J_3$ and $J_6$ act to stabilize the circuit when a signal which cannot be responded to is applied to the circuit 110, 120 and 150.

Due to the left-right symmetry of the T-RS flip-flop circuit, choosing an appropriate value of the current $I_1$ ensures that the current distribution through the junctions $J_1$, $J_2, J_4, J_5, J_7, J_8, J_{10}$, and $J_{11}$ for the states "0" and "1" are also symmetric. Accordingly, if the circuit is in the "1" state, an SFQ pulse arriving at input 124 via system clock terminal 140 switches junction $J_{11}$, which in turn steers additional current into junctions $J_8$ and $J_7$ to thereby switch junction $J_8$, causing most of the current to be steered into the loops $L_6$, $L_{11}$ and hence into the left Josephson junction ring 110. The circuit is switched to the "0" state.

Similarly, if the circuit is in the "1" state, an SFQ pulse arriving at input 122 via second clock terminal 101 switches junction $J_7$, which in turn steers additional current into junctions $J_{10}$ and $J_{11}$ to thereby switch junction $J_{10}$, causing most of the bias current to be steered into the loops $L_6$, $L_{11}$ and hence into the right Josephson ring 120. The circuit is likewise switched into state "1" under such conditions.

If, however, the circuit is already in the "0" state when an SFQ pulse arrives at input 122, practically all of the bias current is flowing through the left Josephson ring 110 already, and the pulse cannot switch the unbiased junction $J_{11}$. Instead, the pulse switches the auxiliary junction $J_{12}$ with no consequence for the state of the circuit. Auxiliary junction $J_9$ works in a similar manner to buffer the T-RS flip-flop circuit when the circuit is already in the "0" state when an SFQ pulse arrives at input 124.

The data signal D and the clock signals $ClK_1$ and $ClK_2$ cause switching of Josephson junctions as described above to place the main inductance 150 in a "0" or a "1" state. When the main inductance is in a "1" state, the SFQ/DC converter 160 will generate a non-zero dc voltage V which is placed on line 180. If the main inductance is in the "0" state, the SFQ/DC converter will generate zero voltage.

The SFQ/DC converter 160 shown in FIG. 1 is a well-known SFQ/DC converter and includes Josephson junctions $J_{13}$ and $J_{14}$, resistors $R_1$, $R_2$ and $R_3$, inductance coils $L_{13}$, $L_{14}$, and $L_{15}$, and a biasing subcircuit including current source $I_2$, junction $J_{15}$, resistor $R_4$ and inductance coil $L_{16}$. Inductance coil $L_{12}$ links the SFQ/DC circuitry to the convenient point 151 of the RSFQ T-RS flip-flop circuit which lies between the loops $L_6$ and $L_{11}$. The SFQ/DC converter produces an output voltage close to the range of 100–150 $\mu$V when the main storage loop 150 is in the "1" state. The output voltage is in the Return-to-Zero format.

Tables 1 and 2 below list the values of the circuit elements shown in FIG. 1 under two presently preferred operating points.

TABLE 1

| Element | Nominal Value | Element | Nominal Value |
| --- | --- | --- | --- |
| $I_1$ | 0.50 mA | $L_1$ | 1.84 pH |
| $I_2$ | 0.40 mA | $L_2$ | 1.05 pH |
| $J_1$ | 0.27 mA | $L_3$ | 0.66 pH |
| $J_2$ | 0.25 mA | $L_4$ | 0.66 pH |
| $J_3$ | 0.22 mA | $L_5$ | 2.10 pH |
| $J_4$ | 0.25 mA | $L_6$ | 2.89 pH |
| $J_5$ | 0.27 mA | $L_7$ | 1.05 pH |
| $J_6$ | 0.30 mA | $L_8$ | 0.66 pH |
| $J_7$ | 0.25 mA | $L_9$ | 0.66 pH |
| $J_8$ | 0.25 mA | $L_{10}$ | 2.23 pH |
| $J_9$ | 0.19 mA | $L_{11}$ | 1.05 pH |
| $J_{10}$ | 0.25 mA | $L_{12}$ | 0.53 pH |
| $J_{11}$ | 0.27 mA | $L_{13}$ | 0.39 pH |
| $J_{12}$ | 0.25 mA | $L_{14}$ | 0.39 pH |
| $J_{13}$ | 0.125 mA | $L_{15}$ | 0.53 pH |
| $J_{14}$ | 0.25 mA | $R_1$ | 2.38 Ω |
| $J_{15}$ | 0.22 mA | $R_2$ | 0.36 Ω |
|  |  | $R_3$ | 0.36 Ω |
|  |  | $R_4$ | 0.71 Ω |

TABLE 2

| Element | Nominal Value | Element | Nominal Value |
| --- | --- | --- | --- |
| $I_1$ | 0.43 mA | $L_1$ | 1.50 pH |
| $I_2$ | 0.14 mA | $L_2$ | 0.42 pH |
| $J_1$ | 0.22 mA | $L_3$ | 0.79 pH |
| $J_2$ | 0.21 mA | $L_4$ | 0.63 pH |
| $J_3$ | 0.21 mA | $L_5$ | 2.52 pH |
| $J_4$ | 0.22 mA | $L_6$ | 2.70 pH |
| $J_5$ | 0.25 mA | $L_7$ | 1.05 pH |
| $J_6$ | 0.24 mA | $L_8$ | 0.53 pH |
| $J_7$ | 0.25 mA | $L_9$ | 0.53 pH |
| $J_8$ | 0.25 mA | $L_{10}$ | 2.79 pH |
| $J_9$ | 0.21 mA | $L_{11}$ | 1.47 pH |
| $J_{10}$ | 0.24 mA | $L_{12}$ | 0.079 pH |
| $J_{11}$ | 0.26 mA | $L_{13}$ | 0.39 pH |
| $J_{12}$ | 0.24 mA | $L_{14}$ | 0.39 pH |
| $J_{13}$ | 0.12 mA | $L_{15}$ | 0.79 pH |
| $J_{14}$ | 0.15 mA | $R_1$ | 2.38 Ω |
| $J_{15}$ | SHORT | $R_2$ | 0.36 Ω |
|  |  | $R_3$ | 0.36 Ω |
|  |  | $R_4$ | 0.71 Ω |

Figure 2:
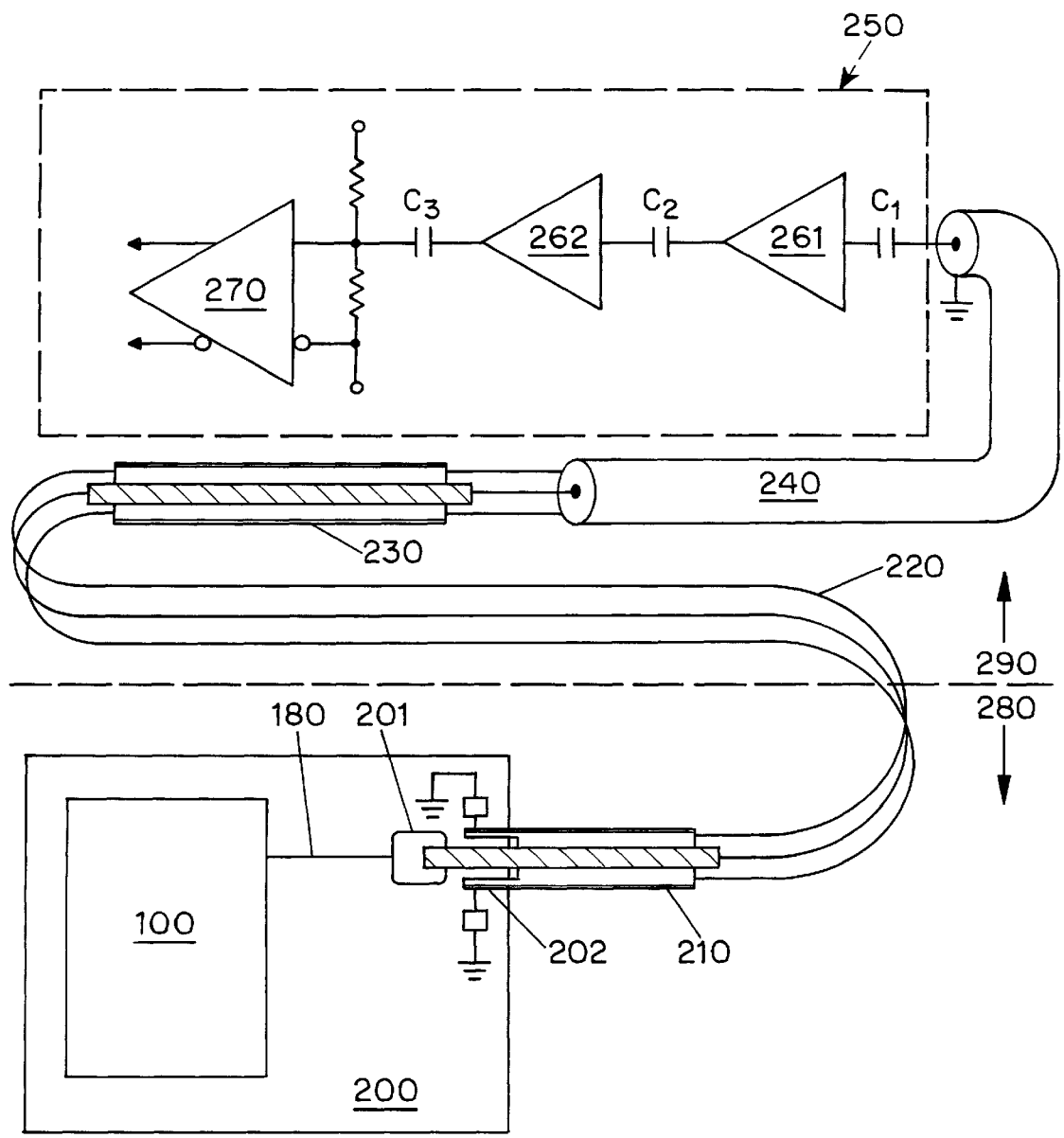
FIG. 2 is a circuit diagram of an exemplary superconductor circuit to semiconductor circuit interface according to the present invention.

Referring to FIG. 2, a superconductor circuit to room temperature semiconductor circuit interface according to the present invention is shown. The thin film superconductor circuit 100 is fabricated on an appropriate substrate 200, and the output line 180 of the circuit 100 is connected to contact pads 201, 202 of a 50 ohm microstrip 210. The chip 200 is placed into a cryogenic probe (not shown) and kept at or below the required critical temperature for the superconductor materials used in the fabrication of the circuit 100. In FIG. 2, the zone indicated by 280 is kept at or below 4° Kelvin. Of course, if a high-temperature superconductor (i.e., a superconductor having a relatively high critical temperature) is used in the fabrication of the circuit 100, a higher minimum temperature for the zone 280 would be required.

The microstrip 210 is connected to a commercially available coplanar waveguide 220 to a second microstrip 230, which is within the room temperature (300° Kelvin) environment 290. A suitable waveguide 220 is the Amp Microstrip Cable Assemblies (Catalog 65069) available from AMP Inc. in Harrisburg, Pa. The room temperature microstrip 230 is interfaced to a standard coaxial cable 240, which delivers the Return-to-Zero output voltage to a semiconductor preamplification circuit 250. The preamplification circuit 250 may include a series of monolithic silicon bipolar microwave amplifiers 261, 262. The amplifiers, which may each have 20 dB gain at 100 Mhz, are cascaded to achieve the input level requirements of an ECL buffer 270 or a comparator.

In the case of an output voltage in the range of 100–150 $\mu$V, three stages of amplification are required to meet the input requirements of 50 mV for an ECL comparator. However, the two stage amplification embodiment shown in FIG. 2 may be employed where the output signal V is preamplified by a superconductor circuit, shown with reference to FIG. 3.

Figure 3:
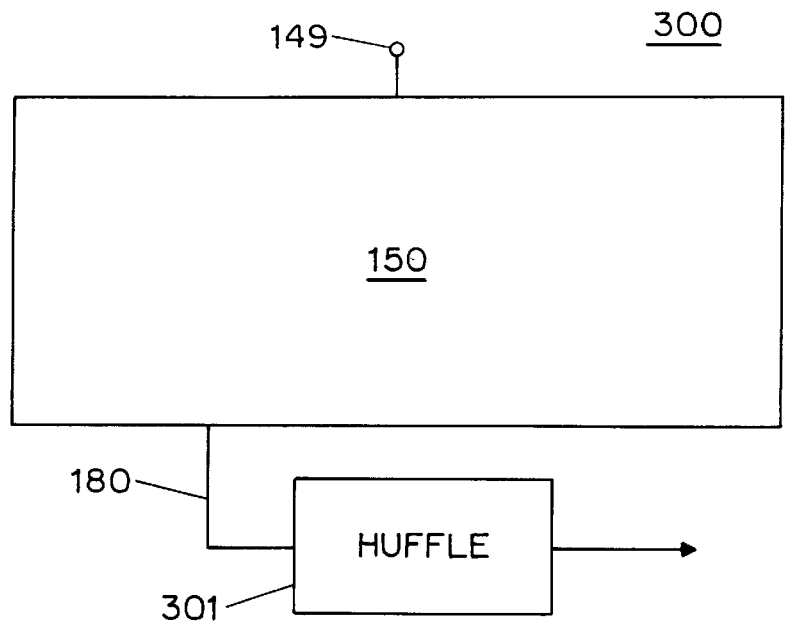
FIG. 3 is a block diagram of an alternative embodiment of the SFQ/DC converter illustrated in FIG. 1.

In the embodiment shown in FIG. 3, the output line 180 of SFQ/DC converter 150 is connected to a HUFFLE driver 301, which is connected to an output line 301. The design and operation of a HUFFLE driver is well known in the field and will not be explained in further detail herein. The HUFFLE driver preamplifies the 100–150 $\mu$V Return-to-Zero signal generated by the SFQ/DC converter 150 into a Return-to-Zero signal having a voltage close to the gap voltage of the Josephson junctions that are employed in the HUFFLE driver. For Nb Josephson junctions, the gap voltage is close to 2.6 mV, and a HUFFLE driver fabricated from Nb junctions will provide an output voltage of approximately 1.5 mV.

Figure 4:
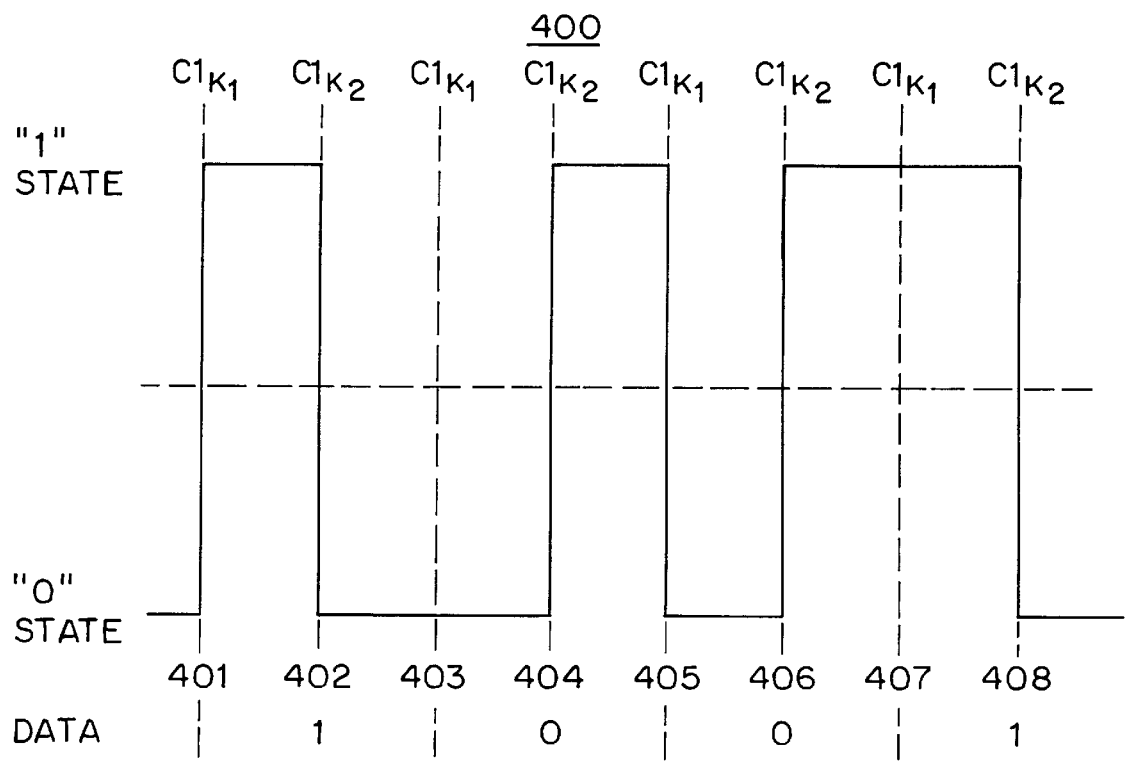
FIG. 4 is a graph illustrative of the form of the output data in accordance with the present invention.

Referring to FIG. 4, the process performed by circuit 100 to encode the SFQ data pulses D into a PSK coded dc output voltage is now described. For purposes of FIG. 4, it is assumed that the system clock signal ClK$_1$ is received at terminal 124 of the circuit of FIG. 1 at the beginning of every clock cycle, and the second clock pulse ClK$_2$ is received at terminal 101 at the midpoint of every clock cycle.

FIG. 4 shows a waveform 400 illustrative of the form of the output data in accordance with the present invention. When the first clock cycle begins 401, the system clock signal ClK$_1$ will arrive at terminal 140 and reset the circuit to the "0" state, as described above. With a certain amount of delay, e.g., 100 ps, after the arrival of the system clock signal ClK$_1$, a data pulse D arrives at the data input 130 and sets the circuit to the "1" state, as described above. The delay is chosen to be larger than the setup time of the circuit, approximately 30 ps, which is negligible when compared to the MHz scale chosen for the system clock. With the circuit in the "1" state, the output V will be a non-zero output (100–150 $\mu$V in a non-HUFFLE circuit).

In the second half of the first clock cycle 402, the second clock signal ClK$_2$ arrives at terminal 101. The portion of the pulse which is directed into the left Josephson junction ring 110 will have no effect on the state of the circuit, as described above, because the circuit is already in the "1" state. However, the portion of the pulse which is directed into the right Josephson junction ring 120 will switch the circuit into the "0" state, i.e., it will toggle the circuit into the opposite state. Thus, a logical "1" representative of a data pulse D arriving at terminal 130 is encoded to be a positive voltage during the first half of the system clock cycle, and a zero voltage during the second half of the system clock cycle.

During the second system clock cycle 403, if no data, i.e., a logical "0" arrives at the terminal 130, there is no pulse which can change the state of the circuit; the circuit is already in the "0" state, and the system clock signal ClK$_1$ arriving at terminal 140 will have no effect on the state of the circuit. On the other hand, the second clock signal ClK$_2$ arrives at terminal 101 at the beginning of the second half of the clock cycle 404, and toggles the circuit to the "1" state. Thus, a logical "0" representative of the absence of a data pulse D arriving at terminal 130 is encoded to be a zero voltage during the first half of the system clock cycle, and a positive voltage during the second half of the system clock cycle.

In this manner, the absence of a data pulse D during the third clock cycle 405 is likewise encoded to be a zero voltage during the first half of the third system clock cycle, and a positive voltage during the second half of the third system clock cycle 406. A data pulse D arriving during the fourth clock cycle 407 is encoded to be a positive voltage during the first half of the fourth system clock cycle, and a zero voltage during the second half of the fourth system clock cycle 408.

The foregoing merely illustrates the principles of the invention. Various modifications and alterations to the described embodiments will be apparent to those skilled in the art in view of applicants' teachings, herein. For example, the circuit could trivially be modified by employing a so-called T$^2$, rather than the above-described T-RS, version of the flip-flip circuit in order to generate a differential PSK code. Such a circuit includes only two inputs, one for data pulses D and a second for the second clock signal CLK$_2$, while eliminating the input for the system clock CLK$_1$. With this modification to the flip-flop circuit, the state of the quantizing inductance loop is toggled by each data pulse D. This modification simplifies the superconductor circuit side of the interface by eliminating the system clock, but requires additional circuitry on the semiconductor circuit side of the interface in order to reconstruct the data D by bay of an exclusive OR function between two successive signals.

Further, although the foregoing was discussed with respect to low temperature superconductor RSFQ circuits, a natural extension would be to employ the PSK encoding SFQ/DC converter described herein with a high temperature superconductor components. It will thus be appreciated that those skilled in the art will be able to devise numerous systems and methods which, although not explicitly shown or described herein, embody the principles of the invention and are thus within the spirit and scope of the invention.

We claim:

1. A circuit for receiving single-flux-quantum data pulses from a superconductor signal source, and first and second clock pulses that are substantially equal in frequency but opposite in phase from first and second clock signal sources, and for encoding and converting said single-flux-quantum data pulses into a phase-shift-keying coded dc output voltage, comprising:

(a) a superconductor rapid single-flux-quantum T-RS flip-flop circuit for phase-shift-keying coding said singleflux-quantum data pulses, said rapid single-flux-quantum T-RS flip-flop cell comprising:

(i) a quantizing inductance having an input end and an output end for storing a current therein in one of two stable states;

(ii) a current source, coupled to said input end of said quantizing inductance, for furnishing an electrical current to said quantizing inductance to establish said stored current;

(iii) a first Josephson junction ring, comprising two pairs of Josephson junctions each pair having an input point therebetween, said first Josephson junction ring being coupled to said input end of said quantizing inductance at a position between said two pairs of Josephson junctions and receiving said data pulse at a first of said input points and said second clock pulse at a second of said input points, for setting a state of said stored current in said quantizing inductance into one of said two stable states and for toggling said set state of said stored current into a reset state; and (iv) a second Josephson junction ring, including two pairs of Josephson junctions each pair having an input point therebetween, said second Josephson junction ring being coupled to said output end of said quantizing inductance at a position between said two pairs of Josephson junctions and receiving said first clock pulse at a first of said input points and said second clock pulse at a second of said input points, for resetting a state of said stored current in said quantizing inductance into one of said two stable states and for toggling said reset state of said stored current into said set state; and (b) a single-flux-quantum/DC converter, coupled to said quantizing inductance loop of said rapid single-flux-quantum T-RS flip-flop circuit and being responsive to said state of said stored current in said quantizing inductance loop, for converting said phase-shift-keying coded single-flux-quantum data pulses into a phase-shift-keying coded dc voltage.

2. The circuit of claim 1, wherein said quantizing inductance comprises a first storage inductance and a second storage inductance connected in series, and wherein said single-flux-quantum/DC converter is coupled to said quantizing inductance at a position between said first storage inductance and said second storage inductance.

3. The circuit of claim 2, wherein said first storage inductance has a greater value than said second storage inductance.

4. The circuit of claim 3, wherein said first storage inductance loop has nominal value of approximately 2.89 pH, and wherein said second storage inductance has a nominal value of approximately 1.05 pH.

5. The circuit of claim 1, further comprising first, second, third and fourth auxiliary Josephson junctions coupled to said superconductor signal source, to said second clock signal source, to said first clock signal source, and to said second clock signal source, respectively, wherein said first input point of said first Josephson junction ring is coupled to said first auxiliary junction to thereby receive said data pulse through said first auxiliary junction, said second input point of said first Josephson junction ring is coupled to said second auxiliary junction to thereby receive said second clock pulse through said second auxiliary junction, said first input point of said second Josephson junction ring is coupled to said third auxiliary junction to thereby receive said first clock pulse through said third auxiliary junction, and said second input point of said second Josephson junction ring is coupled to said fourth auxiliary junction to thereby receive said second clock pulse through said fourth auxiliary junction.

6. The circuit of claim 5, wherein said second auxiliary junction and said fourth auxiliary junction are coupled to a common line, whereby said second input point of said first Josephson junction ring and said second input point of said second Josephson junction ring receive said second clock pulse through said common line.

7. The circuit of claim 6, further comprising first, second and third input inductances, wherein said first input inductance is coupled between said second clock signal source and said common line to receive said second clock signal, said second input inductance is coupled between said superconductor signal source and said first auxiliary junction to receive said data signal, and said third input inductance is coupled between said first clock signal source and said third auxiliary junction to receive said first clock signal.

8. The circuit of claim 1, wherein each of said Josephson junctions is a junction having a nominal value substantially within the range of 0.25–0.27 mA.

9. The circuit of claim 1, further comprising first, second, third and fourth auxiliary inductances, wherein said first auxiliary inductance is coupled between one Josephson junction of said first pair of Josephson junctions in said first Josephson junction ring and said input end of said quantizing inductance, said second auxiliary inductance is coupled between one Josephson junction of said second pair of Josephson junctions in said first Josephson junction ring and said input end of said quantizing inductance, said third auxiliary inductance is coupled between one Josephson junction of said first pair of Josephson junctions in said second Josephson junction ring and said output end of said quantizing inductance, and said fourth auxiliary inductance is coupled between one Josephson junction of said second pair of Josephson junctions in said second Josephson junction ring and said output end of said quantizing inductance.

10. The circuit of claim 1, further comprising a HUFFLE circuit, coupled to an output of said single-flux-quantum/DC converter, for preamplifying said phase-shift-keying coded D.C. voltage into a preamplified coded dc voltage.

11. A circuit for receiving at least one single-flux-quantum data pulse from a superconductor signal source and at least one clock pulse from one or more clock signal source, and for encoding and converting said at least one single-flux-quantum data pulse into a phase-shift-keying coded dc output voltage, comprising:

(a) a superconductor rapid single-flux-quantum flip-flop circuit, including a quantizing element storing a current in one of two stable states and responsive to said at least one clock pulse and to said at least one single-flux-quantum data pulse, for phase-shift-keying coding said at least one single-flux-quantum data pulse; and (b) a single-flux-quantum/DC converter, coupled to said quantizing element of said superconductor rapid single-flux-quantum T-RS flip-flop circuit, and responsive to a state of said stored current in said quantizing element for converting said phase-shift-keying coded single-flux-quantum data pulse into a phase-shift-keying coded dc voltage.

12. The circuit of claim 11, wherein said quantizing element has an input end and an output end and wherein said at least one clock signal sources comprises a first clock signal source generating a first clock pulse and a second clock signal source generating a second clock pulse, and wherein said superconductor rapid single-flux-quantum flip-flop circuit further comprises:

(i) first Josephson junction ring means, coupled to said input end of said quantizing element, to said superconductor signal source and to said second clock signal source, for receiving said at least one single-flux-quantum data pulse and said second clock pulse, and for setting a state of said stored current into one of said two stable states and toggling said set state of said stored current into a reset state; and (ii) second Josephson junction ring means, coupled to said output end of said quantizing element, to said first clock signal source, and to said second clock signal source, for receiving said first clock pulse and said second clock pulse, and for resetting a state of said stored current into said reset state and toggling said reset state of said stored current into said set state.

13. A method for encoding and converting single-flux-quantum data pulses generated by a superconductor signal source into a phase-shift-keying coded dc output voltage, comprising the steps of:

(a) establishing a quantized current in one of two quantized states;

(b) receiving a first clock pulse and any generated single-flux-quantum data pulses during a first portion of a clock cycle;

(c) causing said quantized current to be in a first of said two quantized states if a first predetermined number of said one or more data pulses are received in step (b);

(d) causing said quantized current to be in a second of said two quantized states if a second predetermined number of said data pulses are received in step (b);

(e) receiving a second clock pulse during a second portion of said clock cycle;

(f) toggling said quantized current from said first quantized state to said second quantized state if said quantized current is in said first quantized state, or from said second quantized state to said first quantized state if said quantized current is in said second quantized state; and (g) converting, based on said quantized state of said quantized current, said single-flux-quantum data pulses into a phase-shift-keying coded dc voltage.

14. The method of claim 13, wherein step (c) comprises causing said quantized current to be in a high state if one data pulse is received in step (b) and if said quantized current was in a low state during an immediately preceding clock cycle portion.

15. The method of claim 13, wherein step (d) comprises causing said quantized current to be a low state if no data pulses are received in step (b) and if said quantized current was in a high state during an immediately preceding clock cycle portion.

16. The method of claim 13, wherein step (b) comprises receiving said first clock pulse prior to receiving any generated single-flux-quantum data pulses.

17. The method of claim 16, wherein step (b) further comprises receiving said first clock pulse approximately one hundred picoseconds before receiving said any generated single-flux-quantum data pulses.

18. The method of claim 16, wherein step (c) comprises:

(i) resetting, after receiving said first clock pulse, said quantized current to a low state if said quantized current was in a high state during an immediately preceding clock cycle portion; and (ii) setting, after receiving said any generated single-flux-quantum data pulses, said quantized current to a high state if said any generated dingle-flux-quantum data pulses received comprises one data pulse.

19. The method of claim 16, wherein step (d) comprises resetting said quantized current to a low state if said any generated dingle-flux-quantum data pulses received comprises zero data pulses and if said quantized current was in a high state during an immediately preceding clock cycle portion.

20. The method of claim 13, wherein said second clock pulse received in step (e) is substantially equal in frequency but substantially opposite in phase to said first clock pulse received in step (b).

* * * * *

UNITED STATES PATENT AND TRADEMARK OFFICE
CERTIFICATE OF CORRECTION

PATENT NO. : 5,818,373

DATED : October 6, 1998

INVENTOR(S) : Semenov et al.

It is certified that error appears in the above-identified patent and that said Letters Patent is hereby corrected as shown below:

IN THE CLAIMS:

Column 10, line 61: "from first" should read --from said first--

Column 12, line 40: "D.C." should read --dc--

Column 12, line 44: "source," should read --sources,--

Column 12, line 63: "sources" should read --source--

Column 14, line 27: "dingle-flux-quantum" should read --single-flux-quantum--

Column 14, line 28: "comprises" should read --comprise--

Column 14, line 30: "dingle-flux-quantum" should read --single-flux-quantum--

Column 14, line 31: "prises" should read --prise--

UNITED STATES PATENT AND TRADEMARK OFFICE
CERTIFICATE OF CORRECTION

PATENT NO. : 5,818,373
DATED : Oct. 6, 1998
INVENTOR(S) : Semenov et al.

It is certified that error appears in the above-identified patent and that said Letters Patent is hereby corrected as shown below:

<u>Column 5, line 37</u>: "KHz" should read --kHz--

<u>Column 8, line 62</u>: "fabriacted" should read --fabricated--

<u>Column 9, line 18</u>: "100 Mhz" should read --100 MHZ--

<u>Column 10, line 46</u>: "bay" should read --way--

Signed and Sealed this

Eighteenth Day of April, 2000

Attest:

Q. TODD DICKINSON

*Attesting Officer*     *Director of Patents and Trademarks*